United States Patent [19]
Nordlander

[11] Patent Number: 5,494,499
[45] Date of Patent: Feb. 27, 1996

[54] CRUCIBLE AND METHOD FOR ITS USE

[75] Inventor: Johan Nordlander, Linköping, Sweden

[73] Assignee: Applied Vacuum Technologies 1 AB, Linkoping, Sweden

[21] Appl. No.: 232,172

[22] PCT Filed: Oct. 28, 1992

[86] PCT No.: PCT/SE92/00742

§ 371 Date: Sep. 9, 1994

§ 102(e) Date: Apr. 29, 1994

[87] PCT Pub. No.: WO93/09264

PCT Pub. Date: May 13, 1993

[30] Foreign Application Priority Data

Oct. 29, 1991 [SE] Sweden ................... 9103163

[51] Int. Cl.⁶ ......................................... C23C 14/26
[52] U.S. Cl. .................. 75/10.18; 75/686; 118/726; 266/242; 427/250
[58] Field of Search ............. 118/726; 427/250; 75/10.18, 686; 266/242

[56] References Cited

U.S. PATENT DOCUMENTS

| | | | |
|---|---|---|---|
| 2,665,223 | 1/1954 | Clough et al. | 266/242 |
| 2,962,538 | 11/1960 | Alexander | 118/726 |
| 3,414,251 | 12/1968 | Rall | 427/250 |

FOREIGN PATENT DOCUMENTS

| | | | |
|---|---|---|---|
| 2582319 | 11/1986 | France . | |
| 1207179 | 12/1965 | Germany . | |
| 1521571 | 9/1969 | Germany . | |
| 3420246 | 8/1991 | Germany . | |
| 2240255 | 9/1990 | Japan | 118/726 |

OTHER PUBLICATIONS

Patent Abstracts of Japan—vol. 9, No. 309—Aug. 1985.
Patent Abstracts of Japan—vol. 9, No. 228—May, 1985.
Maissel et al: "Handbook of Thin Film Technology" 1970.

*Primary Examiner*—Melvyn Andrews
*Attorney, Agent, or Firm*—Cushman Darby & Cushman

[57] ABSTRACT

A crucible particularly intended for use when vaporizing aluminum and comprised of an ultralow cement compound. Subsequent to moulding and drying the crucible, the crucible is baked at a high temperature, which corresponds to the temperature of the crucible when used in a vaporizing process, 1,200° C. for instance. The crucible comprises an outer wall and a bottom in which upstanding projections or corrugations are provided. These upstanding projections or corrugations fulfill the function of enabling gas enclosures generated when mixing the cement compound to rise up and collect in the corrugation peaks without impairing the homogeneity of the material in the actual crucible bottom.

12 Claims, 1 Drawing Sheet

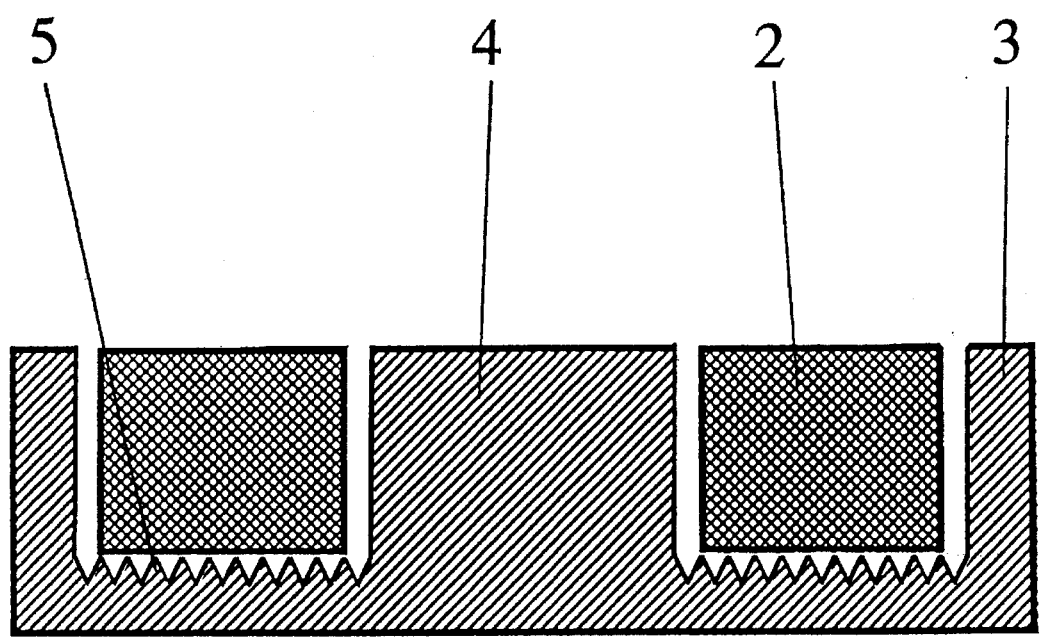

CRUCIBLE AND METHOD FOR ITS USE

BACKGROUND OF THE INVENTION

It is known from Swedish Patent Application No. 9100372-3 to metallize or plate individually plastic CD-discs and like articles for instance, of low melting point while using a metal smelt, for instance an aluminium smelt of relatively high temperature which is briefly held very close to the article to be coated. The method enables articles to be quickly coated or plated while minimizing the deposit of metal at wrong positions.

One of the problems that occur when using an aluminium smelt as the vapourization source resides in maintaining the actual crucible intact. The aluminium smelt in a vapourization source is heated to much higher temperatures (for instance temperatures above 1,200° C.) than those applied in casting operations and similar operations (for instance 800° C.). This means that the actual aluminium smelt will be much more aggressive and behave as a corrosive acid. Since, among other things, it is desired when carrying out the aforesaid method to achieve long periods of use, on the order of one-hundred hours or more, before it is necessary to replace the smelt and crucible, the demands placed on the crucible are greater than the crucible is able to manage when applying hitherto known techniques.

One troublesome circumstance is that the crucible is used in vacuo, i.e. any small aluminium leakages that occur are not sealed automatically by oxidation of the aluminium on the outer surface of the crucible. Crucibles which are self-sealing in ambient atmospheric conditions will thus continue to sweat or to leak in vacuum conditions, which is unacceptable.

In other words, there is a need for a crucible that is intended for molten aluminium and its alloys or compounds to manage high temperatures and to remain impervious even in vacuum conditions.

SUMMARY OF THE INVENTION

This need is fulfilled in accordance with the invention by constructing the crucible from a so-called ultralow cement compound, such as for instance from "Ultracast BSR" (84%, $Al_2O_3$, 0.5% CaO, 0.9% $Fe_2O_3$ and the remainder quartz) from Bohlin & Löfgren AB, or from a corresponding material. The advantage with this type of material is that in induction heating processes, the material will only take-up a small amount of energy, or no energy at all, and the crucible is therefore only heated indirectly by the smelt. The thermal load on the crucible is therefore lower than in earlier cases, while minimizing the heat radiated from the crucible, which is essential when, for instance, carrying out the method taught by Swedish Patent Application No. 9100372-3.

According to a further development of the invention, the crucible produced is further treated by baking the crucible at successively higher temperatures, with the terminal temperature lying generally on the same level as the temperature at which the crucible shall be used, in other words about 1,200° C. Experience has shown that this comprehensive baking process will improve the resistance of the crucible to temperature shocks, therewith reducing greatly the risk of thermal cracks occurring during the heating process and also reducing the risk of leakage from the crucible.

It is believed that the crucible should be baked over a relatively long period of time and at successively higher temperatures. It is also conceived suitable to bake the crucible in a vacuum for as long as possible, under those operational conditions to which the crucible will be subjected in time.

It has been found that the aforedescribed crucible can withstand several days continuous use at high temperatures, for instance 1,200° C. Unfortunately, it has also been found that when vapourizing aluminium, the deposited layer turns a yellowish-brown colour after a time. Consequently, the invention also relates to a further development of a method for preventing such an occurrence when using the crucible.

As used in this document, the terms "low binder" and "ultra low binder", in connection with the cement compound of which the crucible is made have the meanings given for these terms in the relevant edition of the relevant American Society For Testing Materials (ASTM) standard, which are 1–2.5 percent by weight, and 0.2– 1.0 percent by weight, respectively, as will be understood by those skilled in the art.

This is achieved in accordance with the invention by adding carbon, for instance in the form of graphite, to the smelt and also titanium. Practical tests have shown that the aforesaid change in colour of the aluminium coating, hereinafter called discolouration, can be totally avoided in this way.

It has been found that some few percentage of titanium (for instance 3–6%) and some few per thousand or percentage of graphite will be sufficient for this purpose. If too little graphite or too little titanium is added, discolouration will occur. On the other hand, no negative effects have been observed when greater amounts are added, provided that the percentages are so low as not to effect the rate at which the aluminium is vapourized.

The exact manner in which the additions of graphite and titanium clean the vapour deposited layer is unknown and even though the aforesaid quantities of graphite and titanium have been related to the quantities in which aluminium is present, it is possible that instead these quantities are ruled by the size of the vapourized surface or the contact surface of the crucible with the smelt.

The word "added" shall be understood in its widest meaning within the scope of the inventive concept, i.e. the addition may be made in any selected sequence in both solid and molten liquid form. In other words, lose bodies of aluminium, titanium and graphite can be placed in the crucible and thereafter melted (aluminium) and dissolved (titanium and graphite). Alternatively, an aluminium body in which graphite and titanium have been alloyed with the aluminium may be used, as can also an aluminium smelt to which pieces of graphite and titanium have been added and dissolved therein.

BRIEF DESCRIPTION OF THE DRAWING

The invention will now be described in more detail with reference to an exemplifying embodiment thereof illustrated in the accompanying drawing, in which:

The sole figure is a transverse cross-sectional view of a crucible constructed in accordance with principles of the present invention.

DETAILED DESCRIPTION

The drawing figure is a cross-sectional view of a crucible which includes a toroidal, smelt-accommodating space 2. The space 2 is delimited at the outer edge by an outer wall 3, and includes a central crucible projection 4 and a bottom 5. Since the crucible is intended for use with induction-heating processes, a short distance between, for instance, an induction coil located beneath the crucible and the smelt is desirable. The bottom 5 is therefore thin. As will be seen from the drawing, the toroidal, smelt-accommodating space 2 is corrugated or serrated at the bottom, as shown at 5. This corrugation or serration is suitably in the form of concentric circles and enables the bottom 5 to be made thinner than would otherwise be possible. Any bubbles present in the crucible material will rise upwards in the normal way. This means that the bubbles will rise up in the ridges of the corrugated bottom. This reduces the risk that the bubbles will end up in the bottom, which is made as thin as possible, and therewith also the risk of leakage caused by the presence of bubbles in the crucible material is dimensioned.

The crucible is manufactured by shaping the crucible in a corresponding mould, which may consist of silicone rubber for instance. Subsequent to the ultralow cement compound solidifying or hardening, which may take from some hours to about a full calendar day, the crucible is removed from the mould and then baked in a furnace at a temperature of about 1,200° C. The crucible is then ready for use and will have, according to tests carried out, a high thermal-shock resistance. In other words, when heated, the crucible will not crack as a result of the varying temperatures to which it is subjected. The crucible is also highly impervious and, when used, will not allow vapour jets to pass through the crucible walls, despite the fact that the crucible bottom may, for instance, have a thinness of from 5–6 mm. In view of these small wall thicknesses, the raw material used will preferably not have an excessively large particle or grain size.

When seen from a technical aspect, the crucible is not only much better than those crucible variants that are commercially available at present, but is also much cheaper to manufacture.

As a result, the crucible represents a revolutionary decrease in costs and in the problems associated with vapourization techniques, despite the simplicity of the crucible.

When a slight yellowish-brown discolouration of the vapour deposited layer can be accepted (or is perhaps even desired), the crucible can be used without taking any further steps. However, when a more precise "natural" coloured result is required, graphite and titanium are added to the smelt. This can be effected, for instance, by placing a graphite band around the aluminium body placed in the crucible, this aluminium body being smelted down to provide the vapourization bath. Satisfactory results have also been obtained when placing a graphite disc beneath the aluminium.

In the case of tests carried out in practice, the titanium was added in the form of pieces of titanium wire or titanium plates placed beneath the aluminium body to be smelted, and in some instances the titanium was placed on top of graphite plates.

The arrangement of graphite or titanium in a disc beneath the aluminium body or in a ring around the aluminium body to be melted, provides an electrically stable connection which during the smelting phase counteracts the tendency of the aluminium to spit or splash when the aluminium body is heated unevenly and when melting the body by induction heating.

It is conceivable within the scope of the inventive concept to use material other than carbon and titanium and still achieve the result desired. For instance, a material similar to carbon may be used, for instance boron, while some other metal may be used instead of titanium.

I claim:

1. A crucible for a metal melt for use as an evaporation source in vacuum metalization of a substrate, comprising:
  a cup-shaped ultra low cement mass of aluminum oxide and a binder selected from the group consisting of calcium oxide, iron oxide and mixtures thereof; said binder constituting 0.2 to 1.0 percent of said mass.

2. The crucible of claim 1, wherein:
said mass further includes a quartz binder.

3. The crucible of claim 1, wherein:
said cup-shaped mass includes a bottom wall and a peripheral sidewall; and said bottom wall has an inner surface which is corrugated so as to include an alternating pattern of grooves and ridges; said bottom wall including one or more voids, all of which are primarily located in said ridges.

4. A method for providing a metal melt for use as an evaporation source for vacuum metalization of a substrate, comprising:
  (a) providing as a crucible for said melt a cup-shaped ultra low cement mass of aluminum oxide and a binder selected from the group consisting of calcium oxide, iron oxide and mixtures thereof; said binder constituting 0.2 to 1.0 percent of said mass;
  (b) placing a body of aluminum in said crucible; and
  (c) heating in a vacuum said crucible containing said body of aluminum, thereby producing said melt.

5. The method of claim 4, wherein:
step (c) is carried out by induction heating.

6. The method of claim 4, wherein:
step (c) further includes adding graphite and titanium to said melt, for preventing discoloration of aluminum in said melt as aluminum evaporates from said melt.

7. The method of claim 6, wherein:
in step (c), an amount of titanium is added so as to equal 3–6 percent of said body of aluminum, by weight.

8. The method of claim 7, wherein:
in step (c), an amount of graphite is added so as to equal up to 1 percent of said body of aluminum, by weight.

9. The method of claim 6, wherein:
in step (c), an amount of graphite is added so as to equal up to 1 percent of said body of aluminum, by weight.

10. The method of claim 6, wherein:
said graphite is added as a strip which extends around said body of aluminum.

11. The method of claim 6, wherein:
said graphite is added as a disk disposed under said body.

12. The method of claim 6, wherein:
said titanium is added as one of a wire, plate and strip disposed one of under and beside said body.

* * * * *